United States Patent
Sung et al.

(10) Patent No.: US 8,198,711 B2
(45) Date of Patent: Jun. 12, 2012

(54) LEAD FRAME

(75) Inventors: Ki-Bum Sung, Daejeon (KR);
 Jae-Hyun Ahn, Gyeongsangbuk-do
 (KR); Seung-Sue Kang, Pusan (KR);
 Seung-Keun Kim, Seoul (KR)

(73) Assignee: LG Micron Ltd., Gyeongsangbuk-Do (KR)

( * ) Notice: Subject to any disclaimer, the term of this patent is extended or adjusted under 35 U.S.C. 154(b) by 0 days.

(21) Appl. No.: 12/780,583

(22) Filed: May 14, 2010

(65) Prior Publication Data
 US 2010/0219515 A1  Sep. 2, 2010

Related U.S. Application Data

(62) Division of application No. 11/816,775, filed as application No. PCT/KR2006/000636 on Feb. 23, 2006.

(30) Foreign Application Priority Data

Feb. 23, 2005 (KR) .................. 10-2005-0015170
Mar. 3, 2005 (KR) .................. 10-2005-0017744
Mar. 17, 2005 (KR) .................. 10-2005-0022429
Jan. 27, 2006 (KR) .................. 10-2006-0009105

(51) Int. Cl.
 *H01L 31/0232* (2006.01)
(52) U.S. Cl. ........ 257/676; 257/666; 257/730; 257/701; 257/E23.054; 438/123; 438/124
(58) Field of Classification Search .................. 257/666, 257/676, 730, 670, 680, 704, 701, 710, E23.054; 438/123, 124
See application file for complete search history.

(56) References Cited

U.S. PATENT DOCUMENTS

| | | | |
|---|---|---|---|
| 5,175,060 A | 12/1992 | Enomoto et al. | |
| 5,545,850 A | 8/1996 | Mahulikar et al. | |
| 5,969,412 A * | 10/1999 | Matsutomo | 257/670 |
| 6,274,927 B1 * | 8/2001 | Glenn | 257/680 |
| 6,310,390 B1 | 10/2001 | Moden | |
| 6,586,677 B2 * | 7/2003 | Glenn | 174/528 |
| 6,791,166 B1 * | 9/2004 | Foster | 257/666 |

(Continued)

FOREIGN PATENT DOCUMENTS

JP        63-299370 A    12/1988

(Continued)

OTHER PUBLICATIONS

PCT International Search Report.

(Continued)

*Primary Examiner* — Thinh T Nguyen
(74) *Attorney, Agent, or Firm* — Brinks Hofer Gilson & Lione

(57) ABSTRACT

A lead frame includes a plurality of leads electrically connected to a semiconductor chip and a lead lock including a base layer disposed over the plurality of leads and formed of a material having a coefficient of thermal expansion similar to that of inner leads. An adhesive layer is disposed between the base layer and the plurality of leads to fix the plurality of leads and adhere the base layer to the leads. At least one line electrically connects the semiconductor chip to the base layer of the lead lock. Since regions for bus bars are replaced by the lead lock and are removed, the lead frame can be miniaturized and has superior thermal stability and dimension stability.

2 Claims, 4 Drawing Sheets

U.S. PATENT DOCUMENTS

| | | | |
|---|---|---|---|
| 6,964,918 B1 * | 11/2005 | Fan et al. | 438/614 |
| 7,057,280 B2 * | 6/2006 | Yee et al. | 257/730 |
| 2008/0157306 A1 * | 7/2008 | Sung et al. | 257/676 |
| 2010/0219520 A1 * | 9/2010 | Sung et al. | 257/676 |

FOREIGN PATENT DOCUMENTS

| | | |
|---|---|---|
| JP | 04096263 | 3/1992 |
| JP | 06-224361 A | 8/1994 |
| JP | 07-010955 U | 2/1995 |
| JP | 07-074304 A | 3/1995 |
| JP | 07-115169 A | 5/1995 |
| JP | 08-097348 A | 4/1996 |
| JP | 08-274245 A | 10/1996 |
| JP | 11345928 | 12/1999 |
| KR | 10-1997-0072356 A | 11/1997 |
| KR | 10-1998-0081226 A | 11/1998 |
| KR | 10-2001-0026050 A | 4/2001 |
| KR | 10-2001-0053792 | 7/2001 |
| KR | 10-2006-0004248 A | 1/2006 |

OTHER PUBLICATIONS

Office Action from counterpart Japanese Application No. 2007-556088, dated Aug. 2, 2011, 3 pages.

* cited by examiner (a)

(b)

LEAD FRAME

PRIORITY CLAIM

RELATED U.S. APPLICATIONS

This application is a divisional application of U.S. application Ser. No. 11/816,775, filed Aug. 28, 2007, which is a U.S. Nationalization of PCT Application Serial No. PCT/KR2006/000636, filed Feb. 23, 2006, which claims the benefit of Korean patent application No. 10-2006-0009105, filed Jan. 27, 2006, Korean patent application No. 10-2005-0022429, filed Mar. 17, 2005, Korean patent application No. 10-2005-0017744, filed Mar. 3, 2005, and Korean patent application No. 10-2005-0015170, filed Feb. 23, 2005 all of which are incorporated by reference in their entirety herein.

TECHNICAL FIELD

The present invention relates to a lead frame, and more specifically to a lead frame that can be miniaturized in size and has superior dimension stability and thermal stability.

BACKGROUND

A lead frame, together with a semiconductor chip, is an important element constituting a semiconductor package, and functions as both a lead for linking the inside to the outside of the semiconductor package and a support for supporting the semiconductor chip.

FIG. 1 shows the structure of a conventional lead frame.

With reference to FIG. 1, the conventional lead frame comprises a chip pad 2 for mounting a chip as a memory device thereon to maintain the chip in a static state, inner 1 and outer leads 6 for linking the chip to an external circuit, bus bars 4 formed in regions between the chip pad 2 and the inner leads 1 to ground the chip and electrically stabilize the chip, and a lead lock 5 in the form of a composite film formed of an adhesive to fix the inner leads 1.

Since the conventional lead frame must secure the regions for the bus bars 4 to ground the semiconductor chip, there is a limitation in reducing the size of the lead frame. In addition, another problem of the conventional lead frame is that the elements, such as the inner leads 1, are deformed during down setting resulting from the regions for the bus bars 4. These problems will be explained in further detail below. The chip pad 2 is formed in a region lower than regions for the inner leads 1 in order to maintain a constant height during wire bonding of a semiconductor chip mounted on the chip pad 2 to the inner leads 1. At this time, to ensure a difference in height between the chip pad 2 and the bus bars 4 of the lead frame, the region for the chip pad 2 is formed in such a manner that it has two or more steps. As a result, a difference in height between the inner leads 1 and the semiconductor chip is non-uniform, causing frequent deformation of the inner leads 1 during wire bonding between the inner leads 1 and electrodes of the semiconductor chip due to the height difference.

On the other hand, a high-temperature atmosphere is required for easy adhesion of the lead frame to the semiconductor chip. At this time, the lead lock adhered to the top of the lead frame has a coefficient of thermal expansion different from that of the lead frame. Accordingly, when the lead lock, i.e. a composite film, is adhered to the top of the lead frame to fix the lead frame and is then recovered to its original state, the dimension of the lead frame becomes inexact due to the composite film. That is to say, since the lead frame generally has a higher coefficient of thermal expansion than the composite film constituting the lead lock, it is expanded more at a high temperature. Thereafter, the composite film and an adhesive are adhered to the top of the lead frame. After completion of the processing, when the composite film is recovered to its original state at room temperature, distortion occurs between the composite film and the lead frame because the thermal shrinkage of the lead frame is different from that of the composite film. As a result of the distortion, separation between the lead frame and the chip takes place or separation between lead frames varies, thus resulting in formation of defects in the semiconductor chip.

U.S. Pat. No. 5,545,850 discloses an improvement in the adhesion of a lead lock to a molding resin wherein the lead lock includes a metallic layer. The metallic layer is used only to improve the adhesion to the molding resin, thus reducing the risk of delamination at the interface between the lead lock and the molding resin and preventing the occurrence of distortion between the lead lock and a lead frame during wire bonding. However, the function of the metal layer as a ground, power or bus cannot be expected.

SUMMARY

In accordance with various aspects of the invention, there is provided a lead frame, comprising: a plurality of leads electrically connected to a semiconductor chip; a lead lock including a base layer disposed over the plurality of the leads and formed of a material having a coefficient of thermal expansion similar to that of inner leads, and an adhesive layer disposed between the base layer and the plurality of leads to fix the plurality of leads and adhere the base layer to the leads; and at least one line electrically connecting the semiconductor chip to the base layer of the lead lock.

In one embodiment of the present invention, the base layer has a difference in coefficient of thermal expansion within the range of ±10 ppm from the inner leads.

In another embodiment of the present invention, the lead lock may further include an insulating layer formed between the adhesive layer and the base layer.

In another embodiment of the present invention, the insulating layer may be formed by curing a portion of the adhesive layer.

In another embodiment of the present invention, the lead lock may further include a plating layer formed on at least one side of the base layer to reinforce the electrical connection between the line and the base layer.

In another embodiment of the present invention, the plating layer may be made of silver (Ag).

In a preferred embodiment of the present invention, the lead frame may further comprise an external connection terminal and a line for linking the lead lock to the external connection terminal.

According to the lead frame according to the embodiment of the present invention, since regions for bus bars are replaced by the lead lock and are removed, the lead frame can be miniaturized and has superior thermal stability and dimension stability. In addition, since the lead frame is formed in the form of a monolayer during down setting of a chip pad, wire bonding between inner leads and a semiconductor chip can be achieved in a more stable manner. Furthermore, since semiconductor chips are directly mounted on top of the lead lock, distribution of the semiconductor chips is achieved. As a result, heat release effects of the chips can be accomplished and the structure of inner leads can be varied from a centralized type to a distributed type due to the distribution of the chips.

BRIEF DESCRIPTION OF THE DRAWING

The above and other objects, features and other advantages of the present invention will be more clearly understood from the following detailed description taken in conjunction with the accompanying drawings, in which.

DETAILED DESCRIPTION

The present invention will now be described in more detail with reference to the accompanying drawings.

Figure 1:
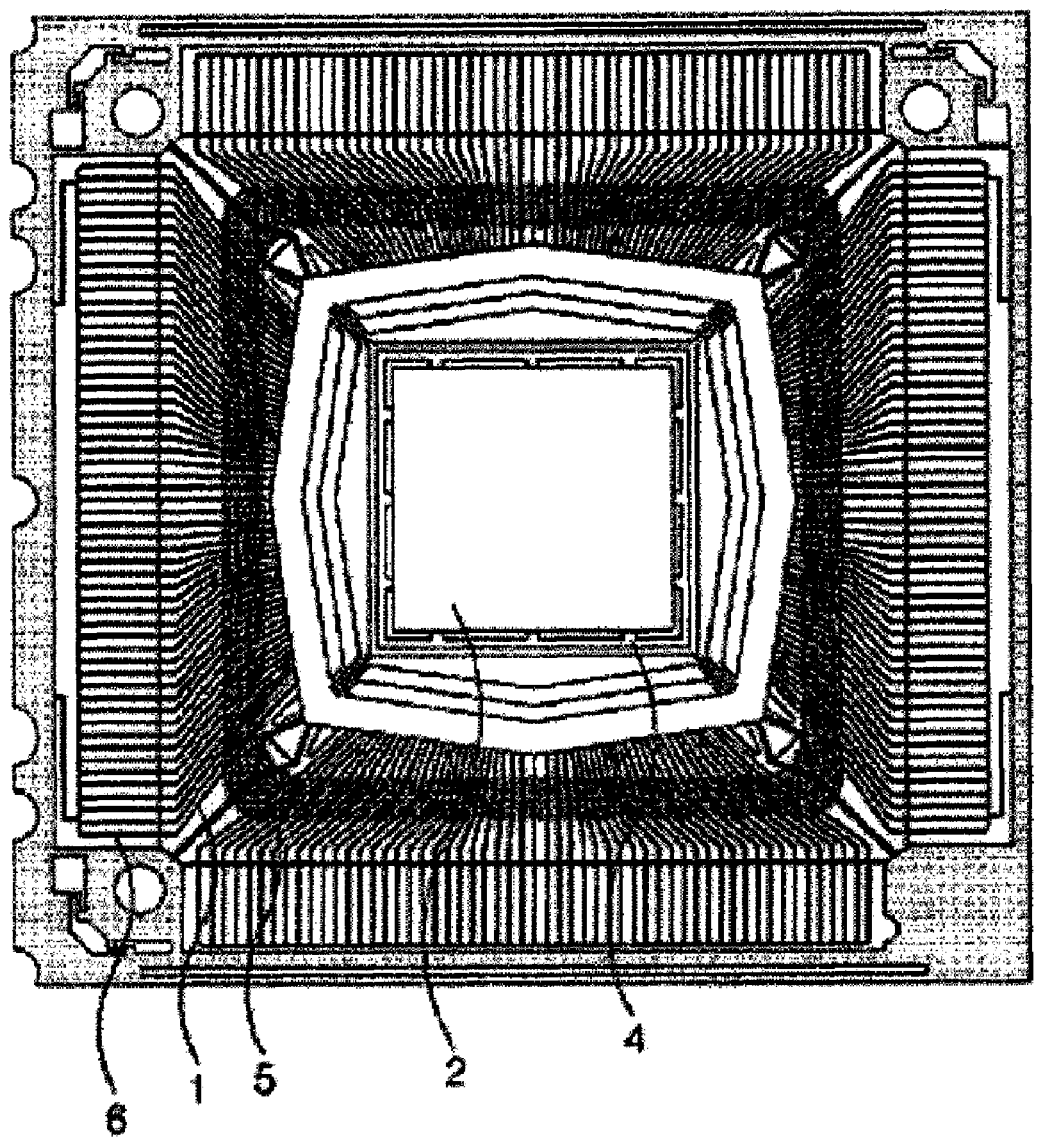
FIG. 1 is a view showing the structure of a conventional lead frame.
Figure 2:
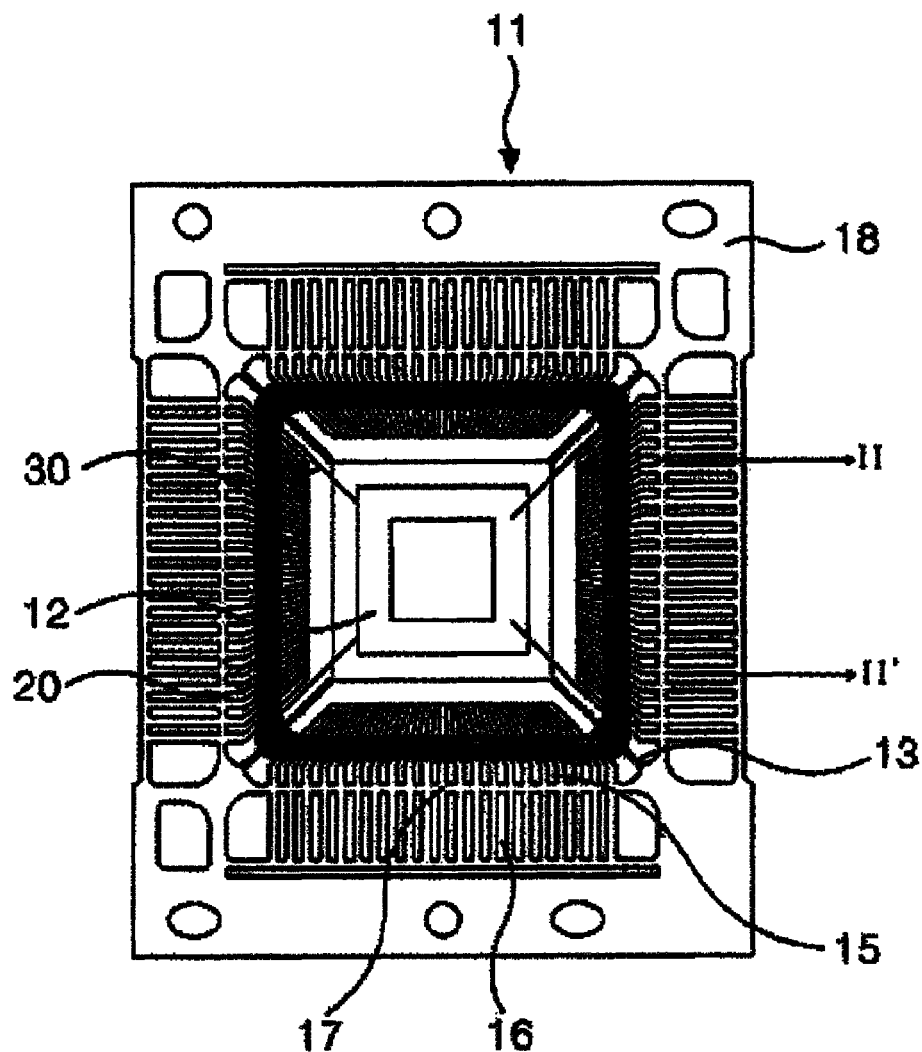
FIG. 2 is a view showing the structure of a lead frame according to one embodiment of the present invention.
Figure 3:
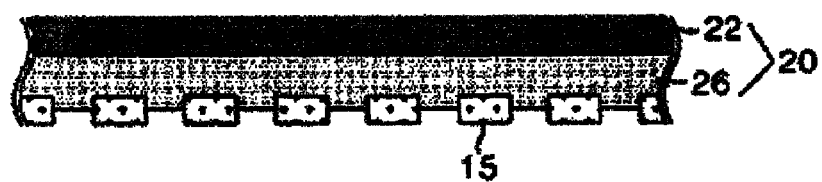
FIG. 3 is a cross-sectional view taken along line II-II' of FIG. 2.

FIGS. 2 and 3 are views showing the structure of a lead frame according to a first embodiment of the present invention.

Referring to FIGS. 2 and 3, the lead frame unit 11 according to the first embodiment of the present invention comprises a chip pad 12 for supporting a semiconductor chip (not shown) mounted thereon, tie bars 13 for supporting the pad 12, inner leads 15 linked to electrodes of the semiconductor chip by wire bonding, outer leads 16 linked to a printed circuit board by soldering after fabrication of a semiconductor package, dam-bars 17 formed at boundaries between the inner leads 15 and the outer leads 16, a rail 18 for supporting the lead frame unit 11 and functioning as a guide during fabrication of a semiconductor package, after which the rail is removed by cutting, a lead lock 20 formed on top of the inner leads 15 and capable of being linked to the semiconductor chip by wire bonding to support the lead frame unit 11 and fix the inner leads 15, and at least one line 30 for electrically connecting the semiconductor chip to the lead lock 20 wherein the lead lock 20 includes a base layer 22 formed of a material having a coefficient of thermal expansion similar to that of the plurality of inner leads 15 and an adhesive layer 26 disposed between the base layer 22 and the plurality of inner leads 15 to fix the plurality of inner leads 15 and adhere the base layer 22 to the leads. In the lead frame 11 of the present invention, since the semiconductor chip is electrically connected to the lead lock 20, the lead lock can advantageously function as a ground, a power and a bus. In addition, the base layer 22 has a coefficient of thermal expansion similar to that of the inner leads 15 so that occurrence of distortion by heat generated during processing, e.g., wire bonding, can be prevented.

FIG. 3 is a cross-sectional view taken along line II-II' of FIG. 2.

Referring to FIG. 3, the lead lock 20 includes a base layer 22 formed of a material having a coefficient of thermal expansion similar to that of the inner leads 15 and an adhesive layer 26 formed under the base layer 22 to fix the base layer 22 to the inner leads 15.

The base layer 22 is formed of a material having a coefficient of thermal expansion similar to that of the inner leads 15. If the inner leads 15 are formed of a highly electrically conductive material, for example, copper, aluminum or silver, the base layer 22 is formed of a material, for example, copper, aluminum or silver, having a coefficient of thermal expansion similar or equal to that of the inner leads 15 and is disposed on top of the inner leads 15. The base layer 22 is formed in a band shape to cover a portion of the inner leads 15. For example, when the inner leads 15 are formed of copper having a coefficient of thermal expansion of 16 ppm, the base layer 22 may be formed of a material having a difference in coefficient of thermal expansion within the range of ±10 ppm from the material for the inner leads 15. Also, when the inner leads 15 are formed of titanium (22 ppm), silver (19.7 ppm), stainless steel (17 ppm) or aluminum (23 ppm), the base layer 22 may be formed of a material having a difference in coefficient of thermal expansion within the range of ±10 ppm from that for the inner leads 15. If the difference in coefficient of thermal expansion between the base layer 22 and the inner leads 15 is out of the range of ±10 ppm, there is a risk that distortion may occur when the lead lock and the inner leads are recovered to their original state at room temperature after adhesion of the lead lock 20 to the inner leads 15.

The adhesive layer 26 is formed on top of the inner leads 15 spaced at regular intervals from the chip pad 12 so as to have predetermined thickness and width, acting to fix the inner leads 15. No thermal deformation or cracks occur even at high temperatures of 250-400° C. in the adhesive layer 26. The adhesive layer 26 may be formed of any suitable material commonly used in the art without any particular restriction so long as it does not flow by melting. For example, the adhesive layer 26 may be formed of a synthetic rubber resin, e.g., polyacrylonitrile, polyacrylate or polyacrylonitrile-butadiene-styrene, a modified resin thereof, a bisphenol A type epoxy resin, or a phenol novolac epoxy resin. The adhesive layer 26 may be formed of a liquid type resin. Specific examples of materials for the adhesive layer 26 include epoxy resins, such as bisphenol A type epoxy resins, bisphenol F type resins, phenol novolac epoxy resins, tetrahydroxyphenyl methane type epoxy resins, novolac type epoxy resins, resorcinol type epoxy resins, polyalcohol.polyglycol type epoxy resins, polyolefin type epoxy resins, and alicylic and halogenated bisphenols. In addition to these epoxy resins, the adhesive layer 26 may be formed of a material selected from enes, such as natural rubbers, polyisoprene, poly-1,2-butadiene, polyisobutene and polybutene, polyoxyethylene and polyoxypropylene. Various additives may be used so that the adhesive layer 26 corresponds to the needs of users. Examples of such additives include synthetic rubber resins, curing agents, softeners, antioxidants, organic solvents, and fillers. At this time, the adhesive layer 26 is uniformly formed under the base layer 22 so that no electrical contact occurs between the base layer 22 and the inner leads 15. Taking into account a pressure generated when the base layer 22 and the adhesive layer 26 are adhered to the inner leads 15, the adhesive layer 26 preferably has a sufficient thickness so that the base layer 22 is not in contact with the inner leads 15. The thickness of the adhesive layer 26 is empirically determined and may be varied taking into consideration the size of the inner leads according to the size of a semiconductor package, the size of the base layer 22, the pressure supplied when the adhesive layer 26 is adhered, ambient conditions for the adhesion, e.g., ambient temperature and curing rate of the adhesive layer 26, and other factors. Therefore, the thickness of the adhesive layer 26 is selectively determined without any particular limitation during processing, if required.

Figure 4:
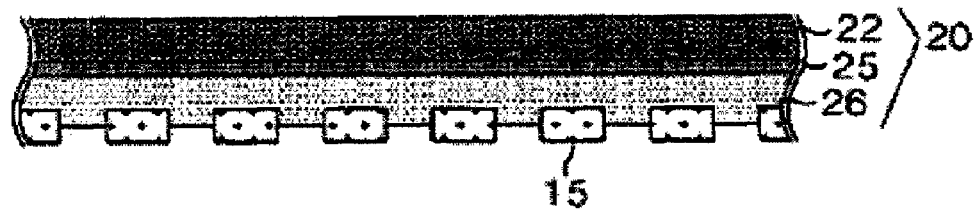
FIG. 4 is a cross-sectional view of a lead frame according to one embodiment of the present invention.
Figure 5:
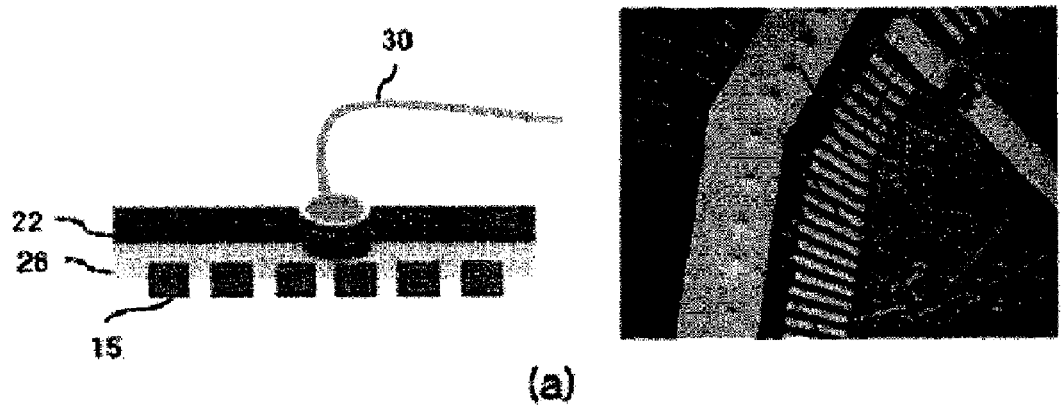
FIG. 5a is a view showing a state in which depression occurs in the absence of an insulating layer.
FIG. 5b is a view showing a state in which no depression occurs in the presence of an insulating layer in accordance with one embodiment of the present invention.
Figure 5:
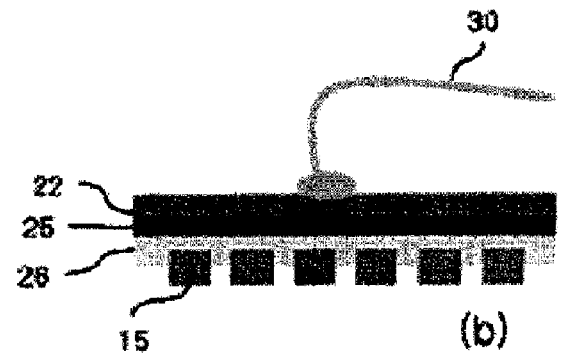

FIG. 4 shows the lead frame further comprising an insulating layer 25 disposed between the adhesive layer 26 and the base layer 22. The insulating layer acts to prevent occurrence of an electrical short between the inner leads 15 and the base layer 22 while the surface of the base layer 22 is depressed by an externally applied force during wire bonding of a line 30 to the top of the base layer 22, as shown in FIG. 5. In addition, since the insulating layer 25 has a strength above a predetermined level, it acts to support the base layer 22 to reduce occurrence of depression and to improve the wire bonding properties of the line 30.

According to another embodiment of the present invention, the insulating layer 25 may be formed by curing a portion of the adhesive layer 25. That is, the insulating layer 25 is formed of the same material as that of the adhesive layer 26 and may form a crosslinked structure by heat curing. In this case, the insulating layer 25 is formed by forming the adhesive layer 26 under the base layer 22, followed by heat curing. The temperature and time for the heat curing may be varied depending on a strength required for the insulating layer 25. Generally, the heat curing may be performed at about 100° C. for 6-48 hours. Next, the adhesive layer 26 can again be formed under the insulating layer 25 to form a lead lock 20.

Examples of materials that can be heat-cured to form the adhesive layer 26 include, but are not especially limited to, epoxy resins, such as bisphenol A type epoxy resins, bisphenol F type resins, phenol novolac epoxy resins, tetrahydroxyphenyl methane type epoxy resins, novolac type epoxy resins, resorcinol type epoxy resins, polyalcohol.polyglycol type epoxy resins, polyolefin type epoxy resins, and alicylic and halogenated bisphenols.

On the other hand, a detailed explanation of the above-mentioned additives will be provided below. A synthetic rubber resin, e.g., polyacrylonitrile, may be added to make the adhesive layer 25 elastic and improve the adhesiveness of the adhesive layer 25.

A curing agent may be added to more rapidly cure the adhesive layer 26 formed below the base layer 22 so as to prevent electrical contact between the base layer 22 and the inner leads 15. After the adhesive layer 26 is in contact with the inner leads 15, the curing agent may be added to rapidly fix the inner leads 15 to the adhesive layer 26.

A softener may be added to prevent the denaturalization of the adhesive layer 26 and reduce the surface tension. Suitable softeners may be of amino silicone, amide silicone, and epoxy silicone types.

An organic solvent may be added to improve the viscosity 26 and processability of the adhesive layer 26. The organic solvent may be used without any particular limitation so long as it is commonly used in the art, and examples thereof include benzene, toluene, xylene, ethylbenzene, butylbenzene, cumene, mesitylene, p-cymene, diethylbenzene, pentylbenzene, dipentylbenzene, dodecylbenzene, 2-methoxyethanol, 2-ethoxyethanol, 1,4-dioxane, chlorobenzene, dichlorobenzene, carbon tetrachloride, nitrobenzene, isopropyl alcohol, γ-butyrolactone, methyl ethyl ketone, methyl acetate, ethyl acetate, propyl acetate, isopropyl acetate, butyl acetate, isobutyl acetate, sec-butyl acetate, pentyl acetate, isopentyl acetate, benzyl acetate, methyl propionate, ethyl propionate, butyl propionate, isopentyl propionate, trichloroethylene, and pyridine. These organic solvents may be used alone or in combination thereof.

A filler can be added to improve the heat resistance and insulating properties of the adhesive layer 26. Examples of such fillers include silica, quartz powder, alumina, calcium carbonate, magnesium oxide, diamond powder, mica, kaolinite, fluorine resin powder, silicon powder, polyimide powder, and zircon powder. These fillers may be used alone or in combination thereof. The amount of the filler used is limited to 70% by weight or less and preferably 5-40% by weight, based on the total solids content. When the filler is used in an amount exceeding 70% by weight, the viscosity of the adhesive layer 26 is lowered during processing and there is a danger that the adhesiveness and strength of the adhesive layer 26 may be deteriorated after curing.

As an antioxidant, there can be used a high-molecular weight hindered phenol having three or more tent-butyl phenol groups in one molecule in an amount of 20% by weight, based on the total solids weight. Specific examples of the antioxidant include 1,3,5-tris(3,5-di-t-butyl-4-hydroxybenzyl)-s-triazine-2,4,6-(1H, 3H, 5H)trione, 1,1,3-tris(2-methyl-4-hydroxy-5-t-butylphenyl)butane, tetrakis[methylene (3,5-di-t-butyl-4-hydroxyhydrocinnamate)]methane, and 1,3,5-trimethyl-2,4,6-tris(3,5-di-t-butyl-4-hydroxybenzyl) benzene.

A reaction promoter may be added to promote the formation of the adhesive layer 26. The reaction promoter is used in an amount of 5% by weight or less, based on the total weight of the composition. The reaction promoter can be used without any particular limitation so long as it is commonly used in the art. Examples of suitable reaction promoters include peroxide compounds, such as methyl ethyl ketone peroxide, cyclohexane peroxide and methyl acetoacetate peroxide.

The base layer is electrically connected to a semiconductor chip. That is, the base layer 22 is electrically connected to a conduction region or a particular electrode of the semiconductor chip, thus acting as a ground necessary for wire bonding between the semiconductor chip and the inner leads 15. As a material for the base layer 22, there can be used a highly electrically conductive metal, e.g., copper, aluminum, silver, titanium or stainless steel.

Figure 6:
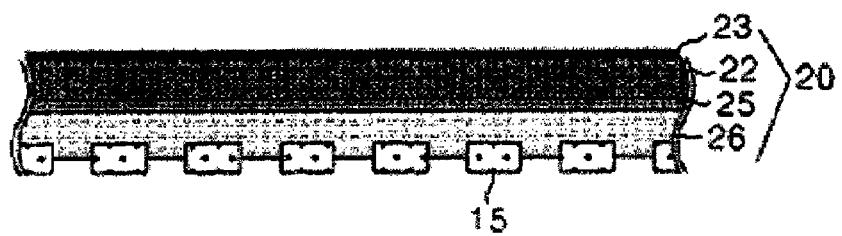
FIG. 6 is a cross-sectional view of a lead frame according to another embodiment of the present invention.

According to a preferred embodiment of the present invention as shown in FIG. 6, a plating layer 22 as a second metal layer can be formed on top of the base layer 22 for particular purposes, for example, an increase in the efficiency of the wire bonding to a semiconductor chip and the rigidity of the bonding. The plating layer 23 plays a role in facilitating the wire bonding of the line 30 linking the semiconductor chip to the base layer 22 and stabilizing the electrical connection. Materials for the plating layer 23 are not particularly limited so long as they have a low melting point and are highly electrically conductive. For example, silver (Ag) is used to form the plating layer 23. The line 30 linked to the base layer 22 is linked to a conduction region or a particular electrode of the semiconductor chip. Thereafter, the base layer 22 is linked to an external ground connection terminal to stabilize the ground connection or enable various processes, including testing of the particular electrode of the semiconductor chip.

The line 30 linked to the base layer 22 will be specifically explained below.

The line 30 serves to electrically connect the base layer 22 to a semiconductor chip and to electrically connect the base layer 22 to an external connection terminal. The electrical connection between the base layer 22 and a semiconductor chip via the line 30 will first be explained. A semiconductor chip is mounted on the chip pad 12 and is then linked to the base layer 22 via the line 30. At this time, the linkage of the semiconductor chip to the base layer 22 can be performed in the same manner as in the linkage of the inner leads 15 to the electrodes of the semiconductor chip. The line 30 can be formed toward regions for the tie bars 13 supporting the chip pad 12. Further, one or more lines may be formed between the semiconductor chip and the base layer 22. In doing so, the grounded structure can be protected from an electrical short due to damage of the line 30 resulting from vibration and shock generated during subsequent processing, for example, sealing, cutting of the lead frame and mounting of the lead frame on a printed circuit board. Another line (not shown) can link the base layer 22 to an external connection terminal in the same manner as in the wire bonding of the inner leads 15 to the electrodes of the semiconductor chip.

Figure 7:
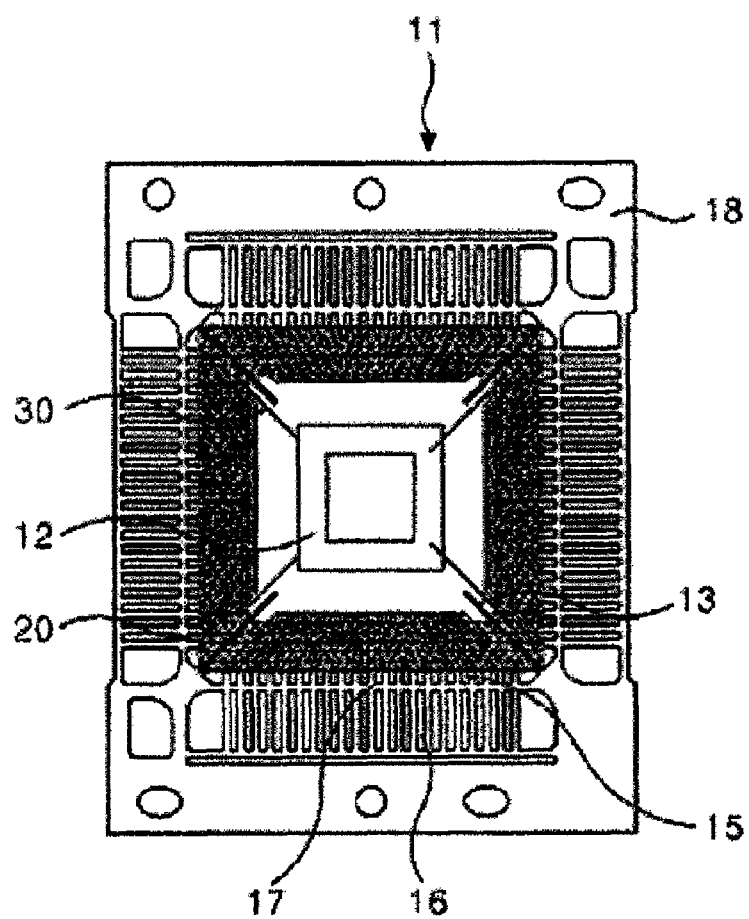
FIG. 7 is a view showing the structure of a lead frame according to another embodiment of the present invention.

On the other hand, as shown in FIG. 7, when the base layer 22 of the lead frame according to the present invention is formed in a sufficiently large area and a semiconductor chip is mounted thereon, electrodes of the semiconductor chip are linked to the respective inner leads 15 arranged along the periphery of the base layer 22 by wire bonding, thereby increasing the number of semiconductor chips to be mounted on the same plane. Methods for vertically mounting semiconductor chips have been employed in conventional lead frames. The vertical mounting of semiconductor chips causes the problem of poor reliability, e.g., deformation of wire bonding. In contrast, since a plurality of semiconductor chips can be mounted on the same plane in the lead frame of the present invention, the above problem can be solved. In addition, since semiconductor chips can be directly mounted on top of the lead lock of the lead frame according to the present invention, distribution of the semiconductor chips is achieved. As a result, heat release effects of the chips can be accomplished and the structure of inner leads can be varied from a centralized type to a distributed type due to the distribution of the chips.

Since the lead frame of the present invention uses the lead lock 20 to ground the semiconductor chip mounted on the chip pad 12, a loss of the inner leads 15, which is caused by linkage of the particular inner leads 15 to the semiconductor chip via a grounding line, can be prevented. To strengthen the grounding of the semiconductor chip in conventional lead frames, ends of the inner leads 15 are sufficiently extended to form bus bars. At this time, regions for the bus bars formed between the chip pad 12 and the inner leads 15 are removed so that the lead frame can be miniaturized. The removal of the bus bars facilitates formation of a step between the chip pad 12 and the inner leads 15. Specifically, in the case where the electrodes of the semiconductor chip mounted on the chip pad 12 are spaced at a greater height than is required from the inner leads 15 during wire bonding, defects are formed in the bonded wire. To prevent the formation of defects, the height of the electrodes of the semiconductor chip electrode and that of the inner leads 15 are controlled by forming the chip pad 12 at a height lower than that of the inner leads 15. Since the conventional lead frames have regions for bus bars, they must have a step between the inner leads 15 and the bus bars. In contrast, since the bus bars are replaced by the lead lock 20 and are removed in the lead frame according to the embodiment of the present invention, formation of a step for regions for bus bars becomes unnecessary. According to the lead frame of the present invention, since grounding can be removed using the lead lock, formation of dendrite due to an interaction between +/− leads can be inhibited, unlike in the use of additional bus bars.

Further, according to one embodiment of the present invention, the line 30 is used to link the base layer 22 to the semiconductor chip by wire bonding, i.e. stitch bonding. That is to say, the formation of the line 30 is programmed in such a manner that a semiconductor chip is mounted on the chip pad 12, followed by wire bonding to link the inner leads 15 to electrodes formed in the chip.

Specifically, the line 30 is formed by a method comprising the following steps: preparing a lead frame comprising inner leads 15, a semiconductor chip mounted by down setting, a chip pad 12 allowing the inner leads 15 to be formed at a predetermined height, and other elements; forming a lead lock 20 including an adhesive layer 26 for fixing the inner leads 15 and a base layer 22 formed on the adhesive layer 26 and formed of an electrically conductive material without occurrence of electrical contact with the inner leads 15; mounting the semiconductor chip on the chip pad 12; and connecting electrodes of the semiconductor chip to the inner leads 15 by wire bonding. During the wire bonding, a line 30 is formed to electrically connect the base layer 22 of the lead lock 20 to a conduction region of the semiconductor chip. The lead lock 20 is electrically connected to one or more of the inner leads 15 and connects the inner leads 15 to an external connection terminal, thereby allowing additional grounding.

The lead frame according to one embodiment of the present invention has been described herein with reference to mounting of one semiconductor chip only. Even when a plurality of semiconductor chips are laminated and packaged, lines can be formed in the same manner as above. Specifically, in the case where a plurality of semiconductor chips are laminated and mounted on the lead frame according to the embodiment of the present invention, a plurality of lines are formed in such a manner that they connects the base layer of the lead lock to conduction regions of the respective semiconductor chips. As a result, the semiconductor chips are electrically stabilized. In addition, when semiconductor chips are laminated, an epoxy molding compound (EMC) can be used to seal lines and a portion of the lead frame. Any epoxy molding compound can be used without any particular limitation so long as it is commonly used in the art.

A lead frame, together with a semiconductor chip, is an important element constituting a semiconductor package, and functions as both a lead for linking the inside to the outside of the semiconductor package and a support for supporting the semiconductor chip.

Therefore, the lead frame of the present invention can be used in the fabrication of memory semiconductors, such as DRAMs, SRAMs and flash memory semiconductors, and non-memory semiconductors, such as microcomponents, logic, analog, discrete devices and optical semiconductors.

The invention claimed is:

1. A lead frame, comprising:
a plurality of leads electrically connected to a semiconductor chip;
a lead lock including an electrically conductive base layer disposed over the plurality of the leads and an adhesive layer disposed between the base layer and the plurality of leads and at least partially encapsulating the plurality of leads to fix the plurality of leads and adhere the base layer to the leads;
an electrically conductive plating layer on at least one side of the base layer; and
a ground line traversing the plating layer and electrically connected to the base layer,
wherein the plating layer stabilizes the connection between the ground line and the base layer.

2. The lead frame according to claim 1, wherein the plating layer comprises one of copper, aluminum, silver, titanium, and stainless steel or a combination thereof.

* * * * *